United States Patent [19]

Mathoorasing

[11] Patent Number: 5,444,727
[45] Date of Patent: Aug. 22, 1995

[54] LASER HEAD

[75] Inventor: Dean Mathoorasing, Issy Les Moulineaux, France

[73] Assignee: France Telecom, Paris, France

[21] Appl. No.: 131,074

[22] Filed: Oct. 1, 1993

[30] Foreign Application Priority Data

Oct. 5, 1992 [FR] France ............... 92 11756

[51] Int. Cl.⁶ ............................ H01S 3/096
[52] U.S. Cl. ............................ 372/38; 372/36
[58] Field of Search ............... 372/36, 38

[56] References Cited

U.S. PATENT DOCUMENTS

| | | | |
|---|---|---|---|
| 4,761,788 | 8/1988 | Dietrich et al. | 372/36 |
| 4,834,491 | 5/1989 | Aoki et al. | 350/96.26 |
| 5,011,247 | 4/1991 | Boudreau et al. | 385/33 |
| 5,327,443 | 7/1994 | Tanaka et al. | 372/36 |

FOREIGN PATENT DOCUMENTS

WO8702834  5/1987  WIPO .

OTHER PUBLICATIONS

J. Schlafer et al, "Microwave Packaging Of Optoelectronic Components", IEEE Transactions On Microwave Theory And Techniques vol. 38, No. 5, May 1990, New York, pp. 518–523.
Patent Abstracts of Japan vol. 15, No. 367 (E-1112) Sep. 17, 1991 & JP-A-31 45 177 (Toshiba).

*Primary Examiner*—James W. Davie
*Attorney, Agent, or Firm*—Blakely, Sokoloff, Taylor & Zafman

[57] ABSTRACT

The invention relates to a laser head comprising a laser diode and a connection device comprising a substrate card of dielectric material on which two disjoint conductive tracks are formed, the laser diode being mounted on said substrate and being electrically connected in series between the conductive tracks, the plate being disposed inside a metal box. Two connectors are mounted on the outside of the box, and each of them is connected to a respective one of said conductive tracks, a first connector serving to connect the laser head to an external electrical feed line, and a second connector being suitable for connection to an external load having a wide passband and an impedance selected so that the impedance of the laser head as seen from the inlet to the first connector is substantially equal to the impedance of the external electrical feed line.

10 Claims, 2 Drawing Sheets

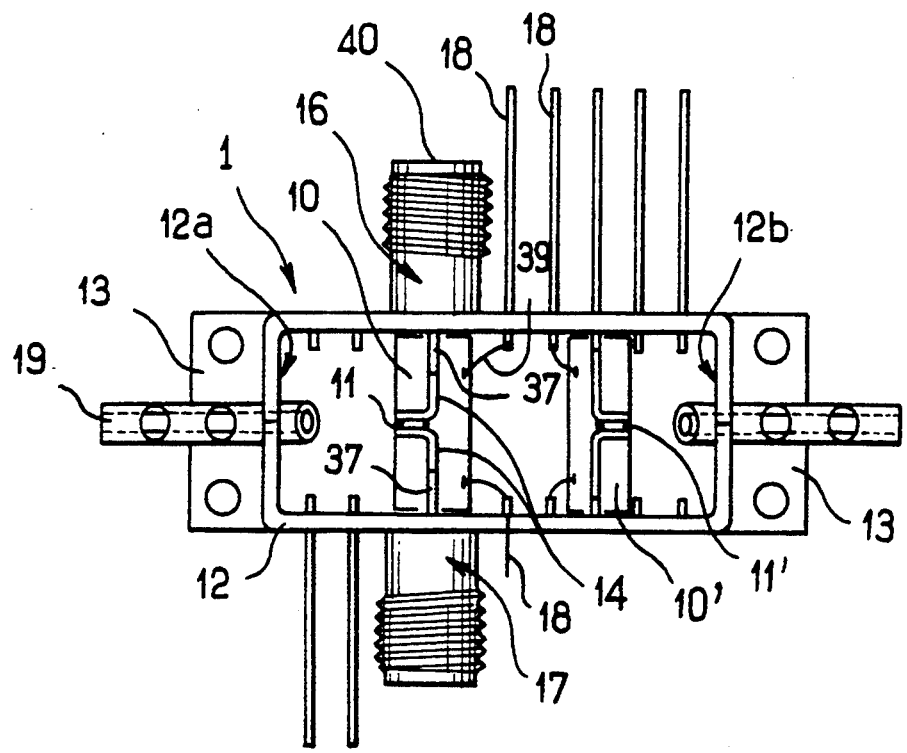
FIG_1
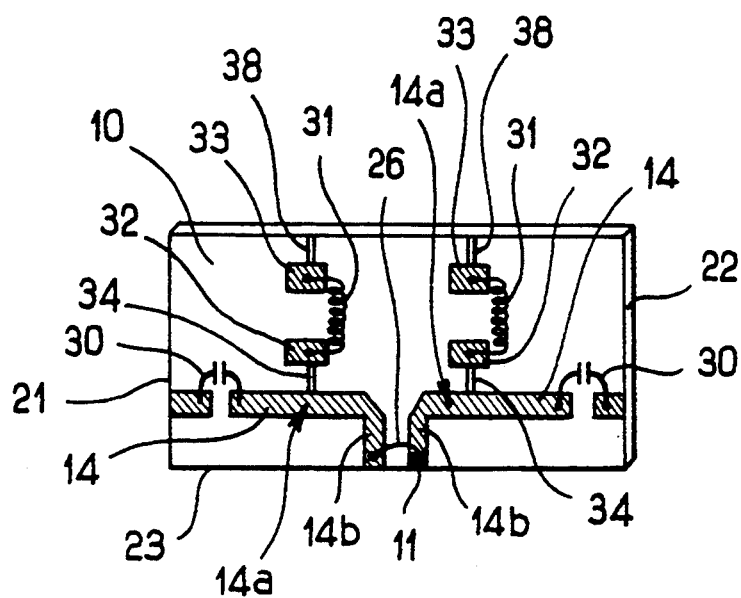
FIG_2

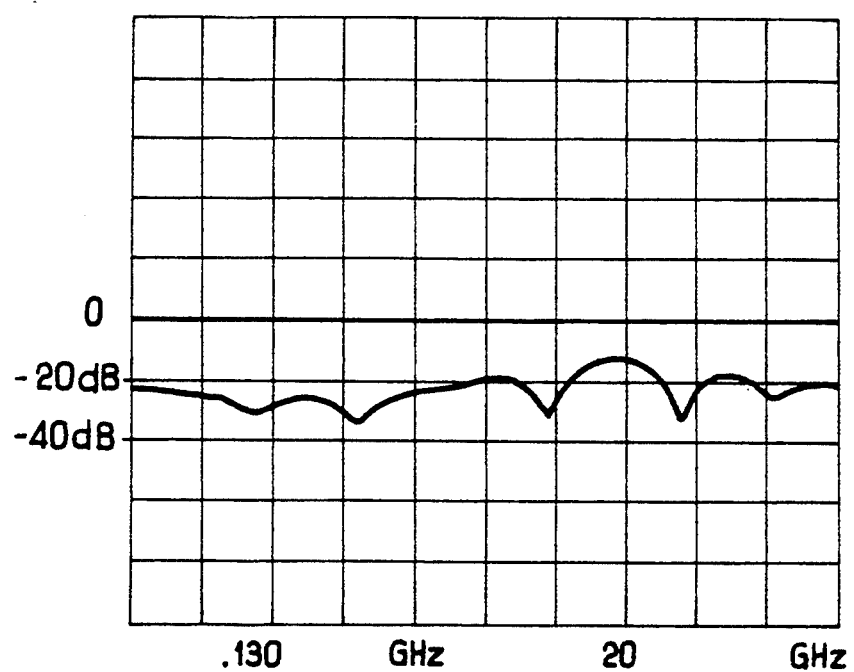
FIG_3

LASER HEAD

FIELD OF THE INVENTION

The present invention relates to optical telecommunications, and more particularly to a laser head comprising a laser diode suitable for converting a high data rate electrical signal into an optical signal, and a connection device for the purpose of electrically connecting the laser diode to an external electrical feed line conveying said electrical signal.

BACKGROUND OF THE INVENTION

Laser diodes present low impedance, of the order of a few ohms, whereas the external electrical feed lines used for conveying an electrical signal to a laser diode are generally of higher impedance, typically 50 ohms.

In order to limit reflection losses on transmission of the signal from the external electrical feed line to the laser diode due to said different impedance values, it is necessary to match the impedance of the laser diode and of the external electrical feed line. Conventionally, such impedance matching has been performed by means of a connection device comprising a resistor deposited as a thin film on a substrate that also has the laser diode deposited thereon, said resistor being electrically connected in series between one of the conductors of the external electrical feed line and one of the electrodes of the laser diode. A bias T is also usually provided comprising a decoupling capacitor and an inductor for feeding the laser diode with bias current. The substrate, the resistor, the laser diode, and the bias T are usually mounted in a metal box that provides screening, that is provided with an external connector for connection to the external electrical feed line, and that is provided with a passage for receiving an optical fiber that is optically coupled to the laser diode. The box provided with the above-specified elements is called a "laser head".

Nevertheless, a laser diode of that type does not provide full satisfaction since the resistor deposited as a thin film presents parasitic capacitance and inductance that distort the signal conveyed by the external electrical feed line, particularly when said signal is a binary signal at a very high data rate, typically greater than 10 Gbits/s. In addition, since the resistor is deposited on the substrate, it prevents distributed feedback (DFB) or distributed Bragg reflector (DBR) type laser diodes being mounted on the substrate since they are particularly sensitive to temperature, so local heating of the substrate due to electricity being dissipated in the thin film resistor would cause the operation of the laser to be unstable.

Proposals have been made to mitigate those drawbacks by progressively changing the shape of the external electrical feed line so as to achieve continuous variation of impedance therealong until it matches the impedance of the laser diode. However, although such a solution eliminates problems of substrate heating, it gives rise to considerable radiation losses and it presents a narrow passband that is ill-suited to the frequency ranges covered by binary signals at high data rates.

OBJECTS AND SUMMARY OF THE INVENTION

An object of the present invention is to remedy the above drawbacks of prior art laser heads, and it seeks in particular to provide an improved laser head that includes a connection device enabling high rate binary data to be transmitted at low distortion, and which is, in addition, simple and cheap.

More particularly, according to a first characteristic of the invention, the connection device comprises a printed circuit card on which two disjoint conductive tracks are formed, the laser diode being mounted on the card and being electrically connected in series with the conductive tracks, the card being disposed inside a metal box on the outside of which two connectors are mounted which are electrically connected to respective ones of the conductor tracks, a first one of the connectors serving for connecting the laser head to an external electrical feed line, and the second one of the connectors being suitable for connection either to an external load of wide passband and of impedance selected so that the impedance of the laser diode as seen at the inlet to the first connector is substantially equal to the impedance of the external electrical feed line, or else to a second external electrical feed line for the purpose of achieving intermodulation.

In a preferred embodiment of the invention, the conductor tracks have respective rectilinear portions extending from opposite edges of the card, that are in alignment with each other, and that are parallel and spaced apart from a third edge of the card interconnecting said opposite edges, said rectilinear portions being extended transversely by segments that extend to said third edge, the laser diode being electrically connected to said segments, the two conductive tracks being interrupted in their rectilinear portions so as to enable a respective decoupling capacitor to be connected in series with each track, the printed circuit card further presenting two pairs of conductive tabs, one of the tabs in each pair being connected to a respective portion of rectilinear conductive track between said interruption and the segment transversely extending said rectilinear portion, and the other tab in each pair serving for connection to a line for feeding bias current to the laser diode, an inductor being electrically connected between the two tabs of each pair.

Advantageously, said conductive tabs are connected respectively to the corresponding rectilinear portion of the conductive track and to a bias current feed conductor wire via narrow conductive tracks that constitute obstacles to high frequency currents.

BRIEF DESCRIPTION OF THE DRAWINGS

Other characteristics and advantages of the present invention will appear on reading the following detailed description of a non-limiting embodiment of the invention, and on examining the accompanying drawings, in which:

FIG. 1 is a diagrammatic plan view of a laser head of the invention;

FIG. 2 is a diagram showing the disposition of the conductive tracks and of the various components on a printed circuit card; and FIG. 3 is a graph showing reflection level as a function of frequency for a laser head of the invention.

MORE DETAILED DESCRIPTION

FIG. 1 shows a laser head 1 in accordance with the invention. The laser head 1 comprises a laser diode 11 mounted on a printed circuit card 10 placed inside a metal box 12. The printed circuit card 10 is rectangular in shape, with the diode being disposed halfway along the edge of a long side of the card, with one of the emitting faces of the laser diode looking out from the card. The box 12 is generally in the form of an elongate rectangular block, and the card 10 extends across the box between its two long side faces so that the outlet face of the laser diode faces one of the short end faces 12a of the box. A passage is provided through said end face 12a to enable an external optical fiber to penetrate into the box for the purpose of being optically coupled to the laser diode. More precisely, the optical fiber is threaded through a sleeve 19 which is fixed to the box and which penetrates inside the box, substantially perpendicularly to the plane of its end face 12a. Fixing tabs 13 are provided at each end of the box 12 to enable it to be fixed on a support (not shown).

The printed circuit card 10 is made by etching a conductive layer (preferably of gold) deposited on one of the faces of a substrate of dielectric material, advantageously aluminum nitride, that has good thermal conductivity, and has high relative dielectric permittivity (Er=8.8).

In accordance with the invention, two disjoint conductive tracks 14 are formed on one face of the card 10, and the laser diode 11 electrically interconnects these two conductive tracks in series. The other face of the printed circuit card 10 is preferably covered in a conductive layer that serves as a ground plane and that is electrically in communication with the box when the card is mounted therein.

In accordance with the invention, the box 12 is provided with external connectors 16 and 17. One of these conductors is used for connection to an external electrical feed line (known per se and not shown) conveying an electrical signal to be converted into a light signal, and the other connector serves either for connection to an external load (known per se and not shown), or else for connection to another external electrical feed line, as described below.

Each of the connectors 16 and 17 which are known per se comprises an externally threaded tubular metal body 40 serving for electrical connection to the shield of a coaxial cable, which shield is electrically connected to the box, and each of the connectors is provided with a central pin 37 for connection to the core of said coaxial cable. The central pins 37 of the connectors 16 and 17 extend inside the box 12 through holes (not shown) and each is connected to a corresponding one of the conductive tracks 14. The connectors used are selected as a function of the frequency range applicable to the electrical signal conveyed by the external electrical feed line. The connectors may, for example, be connectors of the type sold by RADIALL under the reference "SMA".

On the outside, the box 12 has connection pins 18 that are electrically insulated from the box, for purposes explained below.

A laser head 1 of the invention is not limited to a single laser diode per box. Without going beyond the scope of the invention, it is possible to place a second printed circuit card 10' inside the box 12, with the outlet face of the laser diode 11' of said second card 10' then facing towards the end face 12b of the box 12 that is opposite to its face 12a, which opposite end face 12b includes a passage for an optical fiber. Electrical feed to said second laser diode 11' is provided in accordance with the invention and as selected by the person skilled in the art, either by means of connectors (not shown) similar to the connectors 16 and 17, or else by means of the pins 18.

More precisely, FIG. 2 shows a printed circuit card 10 in isolation. As shown, the conductive tracks 14 are preferably in the form of rectilinear portions 14a extending from opposite short end edges 21 and 22 of the card, parallel to a long side edge 23 interconnecting the end edges and spaced apart therefrom, said rectilinear portions 14a being in alignment and being extended transversely at their adjacent ends by segments 14b that extend to the edge 23 and that have the laser diode 11 connected to their free ends. The card 10 is installed in the box 12 by positioning the rectilinear portions 14a in alignment with the pins 37 of the connectors 16 and 17 so as to reduce connection lengths between the pins 37 and the ends of the rectilinear portions 14a that terminate at the end edges 21 and 22, thus minimizing radiation losses.

The width of the tracks 14 is constant throughout the entire length thereof, advantageously lying in the range 250 $\mu$m to 350 $\mu$m, and preferably close to 300 $\mu$m, with the exception of the bends connecting the rectilinear portions 14a to the transverse segments 14b, where the projecting corners are chamfered. The laser diode 11 is bonded, e.g. by means of a drop of indium, onto one of the transverse segments 14b, so that its optical outlet face is flush with the longitudinal side 23 of the card, the bonding providing electrical connection between one of the electrodes of the diode and the segment on which it is bonded, while the other electrode of the diode is connected by means of a conductor wire (preferably made of gold) to the other segment. The spacing between the rectilinear portions 14a and the longitudinal side edge 23 of the card (corresponding to the length of the segments 14b) must be sufficient to isolate the conductive tracks 14 properly from the opposite metal-plated face of the card that acts as the ground plane, nevertheless the segments 14b must be short enough to avoid giving rise to radio frequency (RF) coupling losses between them.

The rectilinear portions 14a are advantageously spaced at 300 $\mu$m from the edge 23, and the two segments 14b are spaced apart by a distance lying in the range 75 $\mu$m to 125 $\mu$m, and preferably 100 $\mu$m.

The rectilinear portions 14a of the conductive tracks 14 are interrupted to enable a decoupling capacitor 30 to be connected in series with each of the portions 14a. The laser diode 11 is fed with bias current by means of two inductors 31 that are electrically connected via respective first terminals to the rectilinear portions 14a between their respective decoupling capacitors 30 and the segment 14b, and via their opposite terminals to respective ones of the above-mentioned connection pins 18. More precisely, each of the inductors 31 is soldered to a pair of conductive tabs 32 and 33 etched in the conductive layer deposited on the substrate, with one of the tabs 32 in each pair being electrically connected to the corresponding portion of the conductive track 14a by means of a narrow track 34 that is narrower than the conductive track 14, thus forming an obstacle to high frequencies, while the other tab 33 in each pair is connected to a conductor wire which is connected to the corresponding pin 18 via another narrow track 38 that is narrower than the conductive tracks 14. The capacitances of the decoupling capacitors 30 and the inductances of the inductors 31 are easily determined by the person skilled in the art as a function of the frequency range covered by the electrical signal coming from the external line.

As mentioned above, one of the connectors, e.g. the connector given reference 17, is suitable for receiving an external load whose impedance is selected to match the impedance of the laser head as seen from the input of the other connector 16 to the impedance of the external electrical feed line. It should be observed at this point that the impedance of the laser diode is small compared with the impedance of the external electrical feed line.

It should be specified that the capacitors and the inductors mentioned above serve, in particular, to prevent the load carrying DC and being heated thereby. The external load, which is known per se, has an impedance that is constant over a wide range of frequencies. It is advantageously constituted by a ring of dielectric material such as polytetrafluorethylene deposited between two circularly cylindrical conductive plates. For example, it may be constituted by a miniature coaxial load of the type sold by RADIALL under the reference R 404 280, and suitable for engaging an above-mentioned "SMA" connector, the two above-mentioned plates being electrically in contact respectively with the central pin 37 and with the outer body 40 of the connector 17.

Advantageously, in a variant, the laser head of the invention enables the connector 17 to be connected to a second external electrical feed line for the purpose of achieving intermodulation. More precisely, under such circumstances, the laser diode 11 is fed from two external electrical feed lines that are connected to the connectors 16 and 17 respectively of the laser head, supplying two signals at different frequencies $f_1$ and $f_2$ and the response of the laser diode to these signals is observed so as to characterize the non-linearity of the diode, in particular by observing harmonics at $2f_1$ and at $2f_2$, and also at $2f_2-f_1$ and at $2f_1-f_2$.

Thus, the invention makes it easy to determine the linearity characteristics of a laser, whereas in known laser heads that have only one connector, intermodulation is performed via a coupling device that is complex and expensive. Advantageously, temperature regulation means may be disposed inside the box 12. Such means are preferably constituted by a Peltier effect cooler (known per se) mounted on the opposite face of the printed circuit card to the face carrying the conductive tracks 14.

Finally, a laser head of the invention makes it possible to transmit binary data at a very high rate with little distortion and with a low level of reflection between the external electrical feed line and the laser head. As shown in FIG. 3, it is thus possible to obtain a reflection level of better than $-14$ dB over a frequency range extending from 130 MHz to 20 GHz. The quality of the laser head in pulse mode will be apparent to persons skilled in the art on observing an eye-diagram of the laser head.

I claim:

1. A laser head comprising a laser diode for converting a high data rate electrical signal into an optical signal, and a connection device designed to connect the laser diode electrically to an external electrical feed line conveying said electrical signal, wherein said connection device comprises a printed circuit card on which two disjoint conductive tracks are formed, the laser diode being mounted on said card and being electrically connected in series with the conductive tracks, the card being disposed inside a metal box on the outside of which an external electrical feed line connector and an external load connector are mounted, said connectors being electrically connected respectively to one of the conductor tracks, the external electrical feed line connector being adapted to connect the laser head to the external electrical feed line, and the external load connector being adapted to connect to an external load of wide passband and of impedance selected so that the impedance of the laser diode as seen at the inlet to the external electrical feed line connector is substantially equal to the impedance of the external electrical feed line.

2. A laser head according to claim 1, wherein the conductor tracks have respective rectilinear portions extending from opposite edges of the card, that are in alignment with each other, and that are parallel and spaced apart from a third edge of the card interconnecting said opposite edges, said rectilinear portions being extended transversely by segments that extend to said third edge, the laser diode being electrically connected to said segments, the two conductive tracks being interrupted in their rectilinear portions so as to enable a respective decoupling capacitor to be connected in series with each track, the printed circuit card further presenting two pairs of conductive tabs, one of the tabs in each pair being connected to a respective portion of rectilinear conductive track between said interruption and the segment transversely extending said rectilinear portion, and the other tab in each pair serving for connection to a line for feeding bias current to the laser diode, an inductor being electrically connected between the two tabs of each pair.

3. A laser head according to claim 1, wherein the printed circuit card is constituted by a substrate of aluminum nitride on which said conductive tracks are implemented by etching a conductive layer deposited on said substrate.

4. A laser head according to claim 1, wherein the width of said conductive tracks lies in the range 250 $\mu$m to 350 $\mu$m.

5. A laser head comprising a laser diode for converting high data rate electrical signals into an optical signal, and a connection device designed to connect the laser diode electrically to external electrical feed lines for conveying said electrical signals, wherein said connection device comprises a printed circuit card on which two disjoint conductive tracks are formed, the laser diode being mounted on said card and being electrically connected in series with the conductive tracks, the card being disposed inside a metal box on the outside of which two connectors are mounted which are electrically connected respectively to one of the conductor tracks, a first one of said connectors being adapted to connect the laser head to a first external electrical feed line, and the second one of said connectors being adapted to connect either to an external load of wide passband and of impedance selected so that the impedance of the laser diode as seen at the inlet to the first connector is substantially equal to the impedance of the first external electrical feed line, or else to a second external electrical feed line for the purpose of achieving intermodulation, wherein the conductive tracks have respective rectilinear portions, extending from opposite edges of the card, that are in alignment with each other, and that are parallel and spaced apart from a third edge of the card interconnecting said opposite edges, said rectilinear portions being extended transversely by segments that extend to said third edge, the laser diode being electrically connected to said segments, the two conductive tracks being interrupted in their rectilinear portions so as to enable a respective decoupling capacitor to be connected in series with each track, the printed circuit card further presenting two pairs of conductive tabs, one of the tabs in each pair being connected to a respective rectilinear portion of conductive track between said interruption and the segment transversely extending said rectilinear portion, and the other tab in each pair being adapted to connect to a line for feeding bias current to the laser diode, an inductor being electrically connected between the two tabs of each pair.

6. A laser head according to claim 5, wherein said conductive tabs are connected respectively to the corresponding rectilinear portion of the conductive track and to a bias current feed conductor wire via, narrow conductive tracks that constitute obstacles to high frequency currents.

7. A laser head according to claim 5, wherein said segments are spaced apart from each other by a distance lying in the range 75 μm to 125 μm.

8. A laser head comprising a laser diode for converting high data rate electrical signals into an optical signal, and a connection device designed to connect the laser diode electrically to external electrical feed lines for conveying said electrical signals, wherein said connection device comprises a printed circuit card on which two disjoint conductive tracks are formed, the laser diode being mounted on said card and being electrically connected in series with the conductive tracks and with two decoupling capacitors and fed with bias current through bias inductances, each track being interrupted to enable a decoupling capacitor to be connected in series with the respective track, the card being disposed inside a metal box on the outside of which two connectors are mounted, said connectors being electrically connected respectively to one of the conductive tracks, a first one of said connectors being adapted to connect the laser head to a first external electrical feed line, and the second one of said connectors being adapted to connect either to an external load of wide passband and of impedance selected so that the impedance of the laser diode as seen at the inlet to the first connector is substantially equal to the impedance of the external electrical feed line, or else to a second external electrical feed line for the purpose of achieving intermodulation.

9. A laser head comprising a laser diode for converting high data rate electrical signals into an optical signal, and a connection device designed to connect the laser diode electrically to external electrical feed lines for conveying said electrical signals, wherein said connection device comprises a printed circuit card on which two disjoint conductive tracks are formed, the laser diode being mounted on said card and being electrically connected in series with the conductive tracks and with two decoupling capacitors and fed with bias current through bias inductances, each track being interrupted to enable a decoupling capacitor to be connected in series with the respective track, the card being disposed inside a metal box on the outside of which two connectors are mounted, said connectors being electrically connected respectively to one of the conductive tracks, a first one of said connectors being adapted to connect the laser head to a first external electrical feed line conveying a first electrical signal at frequency $f_1$, and the second one of said connectors being adapted to connect the laser head to a second external electrical feed line conveying a second electrical signal at frequency $f_2$ for the purpose of utilizing harmonics generated by the laser diode in particular at frequencies $1f_1$, $2f_2$, $2f_2-f_1$, $2f_1-f_2$.

10. The assembly comprising a metal box in the form of an elongated rectangular block and two laser heads placed into said metal box, each laser head comprising a laser diode and a connection device designed to connect the laser diode electrically to external electrical feed lines for conveying electrical signals, wherein said connection device comprises a printed circuit card on which two disjoint conductive tracks are formed, the laser diode being mounted on said card and being electrically connected in series with the conductive tracks and with two decoupling capacitors and fed with bias current through bias inductances, each track being interrupted to enable a decoupling capacitor to be connected in series with the respective track, the card being disposed inside the metal box on the outside of which two connectors are mounted, said connectors being electrically connected respectively to one of the conductive tracks, a first one of said connectors being adapted to connect the laser head to a first external electrical feed line, and the second one of said connectors being adapted to connect either to an external load of wide passband and of impedance selected so that the impedance of the laser diode as seen at the inlet to the first connector is substantially equal to the impedance of the external electrical feed line, or else to a second external electrical feed line for the purpose of achieving intermodulation.

* * * * *

UNITED STATES PATENT AND TRADEMARK OFFICE
CERTIFICATE OF CORRECTION

PATENT NO. : 5,444,727
DATED : August 22, 1995
INVENTOR(S) : Mathoorasing

It is certified that error appears in the above-indentified patent and that said Letters Patent is hereby corrected as shown below:

In Claim 9 in column 8 in line 20 change "at frequencies $1f_1$," to --at frequencies $2f_1$--.

Signed and Sealed this

Thirteenth Day of February, 1996

Attest:

BRUCE LEHMAN

*Attesting Officer*     *Commissioner of Patents and Trademarks*